United States Patent
Murtuza et al.

(10) Patent No.: US 6,888,255 B2
(45) Date of Patent: May 3, 2005

(54) BUILT-UP BUMP PAD STRUCTURE AND METHOD FOR SAME

(75) Inventors: Masood Murtuza, Sugar Land, TX (US); Muthiah Venkateswaran, Richardson, TX (US); Satyendra Singh Chauhan, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/449,212

(22) Filed: May 30, 2003

(65) Prior Publication Data

US 2004/0238953 A1 Dec. 2, 2004

(51) Int. Cl.[7] .............................................. H01L 23/48
(52) U.S. Cl. ...................... 257/778; 257/737; 257/738; 438/613; 228/180.22
(58) Field of Search ................................ 257/778, 737, 257/738; 438/613; 228/180.22

(56) References Cited

U.S. PATENT DOCUMENTS 6,335,571 B1 * 1/2002 Capote et al. ............... 257/787
6,476,494 B1 * 11/2002 Hur et al. .................... 257/762
6,669,079 B2 * 12/2003 Li et al. ...................... 228/262.9
6,708,871 B2 * 3/2004 Pierson ........................ 228/246
2003/4201309 * 10/2003 Grigg et al. ................. 228/207

FOREIGN PATENT DOCUMENTS

JP 10-209623 * 8/1998 ............ H05K/3/34

OTHER PUBLICATIONS

U.S. Appl. No. 10/445,163, filed May 23, 2003, entitled-:*System and Method for Increasing Bump Pad Height*.

* cited by examiner

*Primary Examiner*—Jasmine Clark
(74) *Attorney, Agent, or Firm*—Yingsheng Tung; Wade James Brady, III; Frederick J. Telecky, Jr.

(57) ABSTRACT

In accordance with the present invention, a built-up bump pad structure and method for the same are provided. The bump pad structure includes a substrate, a bump pad disposed upon the substrate, a solder mask disposed upon the substrate defining an opening around the bump pad, and a conductive material deposited upon the bump pad such that the conductive material at least partially fills the opening around the bump pad.

10 Claims, 1 Drawing Sheet

BUILT-UP BUMP PAD STRUCTURE AND METHOD FOR SAME

TECHNICAL FIELD OF THE INVENTION

The present invention relates in general to semiconductor manufacturing and, in particular, to a built-up bump pad structure and method for the same.

BACKGROUND OF THE INVENTION

Flip chips are microelectronic devices in which a silicon chip, or die, is attached facedown to a substrate via a plurality of small solder bumps. In general, a die attach system "picks and flips" the die directly from a silicon wafer and places the die on the substrate using a plurality of solder bumps to form an electrical connection with a plurality of bump pads on the surface of the substrate. Once the solder has been reflowed and solidified, a non-conductive underfill material is typically inserted into the gap between the die and substrate to strengthen the connection between the two and to provide a barrier to moisture or other contaminants.

As chip sizes have decreased over time, flip chip assemblies have also decreased in size. These smaller chip sizes require narrower bump pitches and, therefore, smaller bump sizes. This typically results in the flip chip having a decreased stand-off height between the die and the substrate, which may increase the level of stress at the connection between the solder bumps and the die due to the differences in the coefficients of thermal expansion (CTE) of the die and substrate. Additionally, shrinking chip sizes have lead to increasingly tighter assembly tolerances, which can negatively impact production yields and make it difficult to interchangeably use substrates from different manufacturers that may have different tolerances.

SUMMARY OF THE INVENTION

In accordance with the present invention, a built-up bump pad structure and method for the same are provided. The bump pad structure comprises a substrate, a bump pad disposed upon the substrate, a solder mask disposed upon the substrate defining an opening around the bump pad, and a conductive material deposited upon the bump pad such that the conductive material at least partially fills the opening around the bump pad.

Technical advantages of particular embodiments of the present invention include a bump pad structure that reduces the thickness of the solder mask above the bump pad. This reduction in the height of the solder mask above the bump pad allows for the use of fine pitch bump pads which are less sensitive to assembly tolerances, and, therefore, result in higher production yields.

Another technical advantage of particular embodiments of the present invention is the ability to standardize substrates having different assembly tolerances for use in manufacturing flip chips. This may be accomplished by building up the bump pad structures of the substrates as needed, until all the substrates have similar assembly tolerances. This allows substrates supplied by different manufacturers having different tolerances to be used in the same flip chip assembly, regardless of their original tolerances.

Yet another technical advantage of particular embodiments of the present invention is a bump pad structure that can be used with low-cost, photo-imageable substrate materials, which helps reduce flip chip manufacturing costs and production times.

Still another technical advantage of particular embodiments of the present invention is the ability to increase the stand-off height of the flip chip assembly. By attaching the solder bumps connecting the die and substrate to the larger bump pad structures, the solder bumps are effectively seated higher on the substrate. This increases the stand-off height of the flip chip, helping to reduce the stress on the solder joints due to any difference in CTE between the die and the substrate, and improving the reliability of the flip chip assembly.

Other technical advantages will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following descriptions, taken in conjunction with the accompanying drawings, in which.

DETAILED DESCRIPTION OF THE INVENTION

Figure 1:
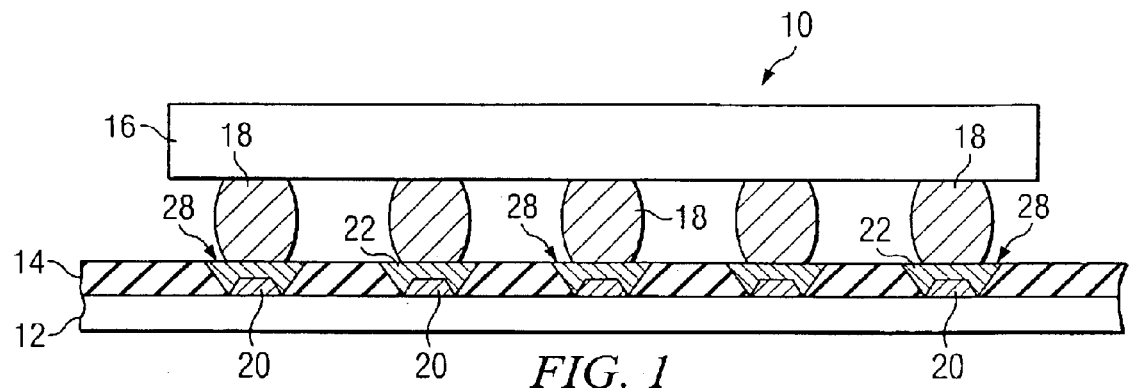
FIG. 1 illustrates a side-view of a flip chip assembly having a bump pad structure in accordance with a particular embodiment of the present invention.

FIG. 1 illustrates flip chip assembly 10 in accordance with a particular embodiment of the present invention. Flip chip assembly 10 is a flip chip in which a conductive material has been deposited on each of the bump pads on the surface of the substrate, at least partially filling the opening in the solder mask around each bump pad. This conductive material increases the height of the bump pad structure, which in turn increases the stand-off height of flip chip assembly 10. The addition of the conductive material also reduces the thickness of the solder mask above the bump pad structure, which results in the flip chip assembly being less sensitive to assembly tolerances. Additionally, substrates having differing tolerances may be standardized by adding conductive material to the bump pad structures as needed until all the substrates share a common tolerance level.

As shown in FIG. 1, flip chip assembly 10 includes die 16 and substrate 12, which are positioned generally parallel with, and spaced apart from, one another.

Substrate 12 is typically constructed using ceramic or organic materials. A plurality of bump pads 20 are disposed on the upper surface of substrate 12. These bump pads 20 are typically constructed out of copper or some other conductive material, and connect to circuitry within substrate 12 that allows substrate 12 to electrically couple die 16 with an external device (not illustrated).

Substrate 12 also includes a solder mask 14 disposed upon its upper surface, such that solder mask 14 defines an opening around each of the plurality of bump pads 20. Typically, this solder mask 14 is a photo-imageable material, although other materials are also possible.

As shown in FIG. 1, each bump pad 20 is illustrated as being a non-solder mask defined (NSMD) pad. This means that the area of the opening in the solder mask is larger than the area of the bump pad. It should be recognized by one of ordinary skill in the art, however, that bump pad 20 could also be a solder mask defined (SMD) pad, in which the bump pad extends under the solder mask such that the area of the bump pad that is exposed is defined by the opening in the solder mask. Furthermore, it should be recognized that although the openings in solder mask 14 are illustrated as featuring a circumferential taper, the openings in solder mask need not be tapered, and can, in fact, be tapered in the opposite direction, all within the teachings of the present invention.

A conductive material 22 is deposited upon each of the plurality of bump pads 20, at least partially filling the opening around each bump pad 20 formed by solder mask 14. Conductive material 22 may include copper, gold, nickel, or some other suitable conductive material, and may be deposited into the opening around each bump pad 20 by plating or printing the material 22 into the opening. So deposited on bump pad 20, conductive material 22 and the bump pad 20 the conductive material is deposited upon form larger bump pad structure 28.

Depositing conductive material 22 upon bump pad 20 in this manner increases the overall height of the bump pad structure 28. As shown in FIG. 1, conductive material 22 is deposited upon each bump pad 20 such that the upper surface of the conductive material 22 is flush with the surface of solder mask 14. However, it should be recognized by one of ordinary skill in the art that conductive material 22 need not extend all the way to the top of solder mask 14. Instead, any amount of conductive material 22 deposited upon bump pad 20 may be within the teachings of the present invention. As such, conductive material 22 could even extend beyond the surface of solder mask 14, provided that the conductive material 22 above any one bump pad 20 would not contact the conductive material 22 above an adjacent bump pad 20, causing a short.

Above each bump pad structure 28, flip chip assembly 10 also includes a solder bump 18, which is constructed of a conductive material. Examples of such conductive materials include gold; eutectic tin-lead (Sb—Pb), high lead (Pb), tin-silver (Sn—Ag), and tin-silver-copper (Sn—Ag—Cu) solders; and other conductive alloys. The plurality of solder bumps 18 help to form a rigid, electrical connection between die 16 and bump pad structure 28.

Generally, the plurality of solder bumps 18 is first applied to die 16 in a process referred to as "bumping". In this process, solder bumps 18 are connected to the interconnect layer (not illustrated) on the lower face of die 16. Die 16 and the attached solder bumps 18 are then positioned over substrate 12, such that each solder bump 18 is aligned with a corresponding bump pad structure 28 on the upper surface of substrate 12. With the plurality of solder bumps 18 disposed between, and in contact with, the interconnect layer of die 16 and the plurality of bump pad structures 28, a rigid connection may be formed between die 16 and substrate 12 by reflowing and then solidifying the plurality of solder bumps 18.

Figure 2:
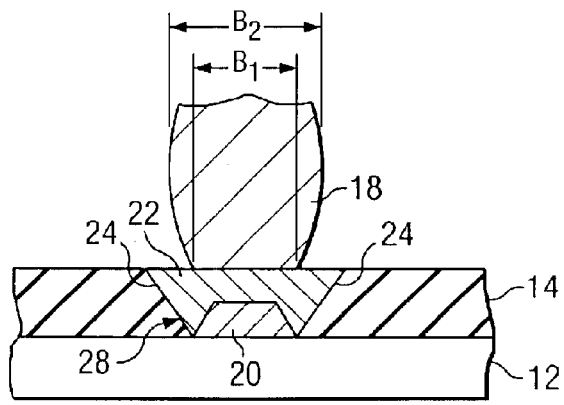
FIG. 2 illustrates a close-up, side-view of the bump pad structure of the flip chip assembly shown in FIG. 1.

A close-up side-view of one of the bump pad structures 28 and solder bumps 18 of flip chip assembly 10 is shown in FIG. 2.

As previously mentioned, bump pad 20, which may include a number of conductive materials known in the art, is disposed upon the upper surface of substrate 12.

Solder mask 14 is also disposed upon the upper surface of substrate 12, such that solder mask 14 defines an opening around bump pad 20.

As shown in FIG. 2, solder mask 14 frequently extends above the upper surface of bump pad 20. A solder mask 14 that extends too far above the upper surface of bump pad 20 may prevent the use of fine pitch solder bumps due to the fact that fine pitch solder bumps are relatively short. Although an attempt could be made to increase the height of the solder bumps by increasing the volume of the solder bumps, such attempts often increase the diameter of the bump pads as well as the height, defeating the goal of using fine pitch bumps. Therefore, solder masks that extend too high above the bump pad typically limit or preclude the use of fine pitch solder bumps. In these situations, flip chip manufacturing is normally constrained by the tighter tolerances dictated by the diameter of a solder bump that is tall enough to reach the surface of the bump pad through the opening in the solder mask. Unfortunately, these tighter assembly tolerances can frequently lead to reduced production yields, as the higher tolerances are hard to accommodate in typical production processes.

To help alleviate this high sensitivity to the tolerance level of flip chip assembly 10 (FIG. 1), conductive material 22 is deposited upon bump pad 20, at least partially filling the opening in solder mask 14 around the bump pad.

By depositing conductive material 22 in upon bump pad 20 to form bump pad structure 28, the height difference between bump pad structure 28 and solder mask 14 is reduced. This reduced height allows for the use of fine pitch solder bumps, as shown in FIG. 2. Rather than being constrained by diameter $B_2$, the diameter of solder bump 18 at some level above the surface of the bump pad 20, the assembly tolerances are instead constrained by diameter $B_1$, the diameter of solder bump 18 at the surface of the solder mask 14. This is due to the fact that solder bump 18 need not extend beyond the surface of solder mask 14 to bump pad 20, and instead need only extend to the surface of bump pad structure 28. Furthermore, since $B_1$ is typically smaller than $B_2$, the smaller diameter $B_1$ allows more latitude in the placement of solder bump 18 upon bump pad structure 28, and thus looser production tolerances.

The ability to increase the tolerances of substrate 12 by plating or printing conductive material 22 onto bump pad 20 also allows substrates originally having different tolerances to be brought to a uniform tolerance level by plating (or printing) up the bump pads until a desired tolerance level is achieved. This allows for the standardization of substrates, regardless of their original supplier or tolerance level, and can help to reduce manufacturing costs.

The deposition of conductive material 22 upon bump pad 20 to form bump pad structure 28 also helps to increase the stand-off height of flip chip assembly 10 (FIG. 1) by raising the surface to which solder bump 18 attaches. This increased stand-off height helps to reduce the stress at the connection between die 16 and solder bump 18 due to any differences in the CTEs of die 16 and substrate 12 and eases the insertion of underfill material.

Bump pad structures 28 in accordance with the present invention also allow for the use of low-cost, photo-imageable substrates and solder masks, rather than relying on high-cost laser-processing. This helps reduce costs and production times as photo-imaging is typically less time-consuming that laser-processing.

Figure 3:
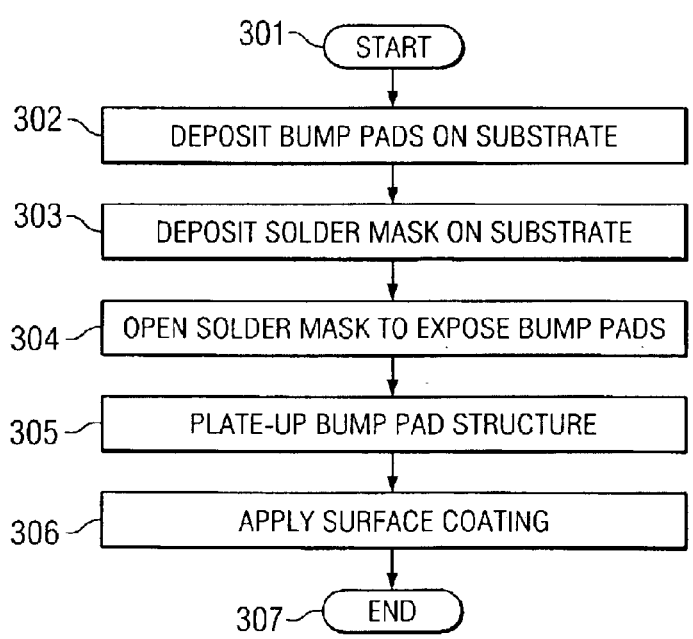
FIG. 3 illustrates a flowchart of a method of forming a bump pad structure in accordance with a particular embodiment of the present invention.

FIG. 3 illustrates a flowchart of a method of forming a bump pad structure in accordance with a particular embodiment of the present invention.

After starting in block 301, a plurality of bump pads are deposited upon a substrate in block 302. These bump pads connect with circuitry within the substrate and are operable to form an electrical connection with a die when coupled to the die with a solder bump.

A solder mask is then deposited on the substrate in block 303, and opened in block 304, such that the solder mask defines a plurality of openings, one around each of the plurality of bump pads, which may be either SMD or NSMD bump pads.

A conductive material, such as copper, gold, or nickel, is then deposited upon each of the bump pads, at least partially filling the opening around each bump pad, in block 305. This may be accomplished by plating or printing the material upon the bump pad, among other ways. As mentioned above, the addition of this conductive material on top of the bump pad results in a bump pad structure that is higher on the face of the substrate. This helps to increase the stand-off height of the flip chip. The plated-up bump pad structure may also be larger in diameter than the bump pad itself, presenting a larger surface for a solder bump to connect with, allowing the flip chip to be manufactured with looser assembly tolerances and improving production yields.

Finally, in block 306, a surface coating, such as a nickel-gold mixture, solder, or an organic solder protection (OSP) layer, may be applied to the surface of the solder mask and bump pad structure, before the process ends in block 307.

Although particular embodiments of the method and apparatus of the present invention have been illustrated in the accompanying drawings and described in the foregoing detailed description, it will be understood that the invention is not limited to the embodiments disclosed, but is capable of numerous rearrangements, modifications, and substitutions without departing from the spirit of the invention as set forth and defined by the following claims.

What is claimed is:

1. A bump pad structure, comprising:
    a substrate;
    a bump pad disposed upon the substrate;
    a solder mask disposed upon the substrate defining an opening around the bump pad; and
    a plated conductive material or a printed conductive material upon the bump pad which at least partially fills the opening around the bump pad.

2. The bump pad structure of claim 1, wherein the conductive material deposited upon the bump pad reduces a height of the solder mask above the bump pad.

3. The bump pad structure of claim 1, wherein the conductive material includes copper.

4. The bump pad structure of claim 1, wherein the conductive material includes gold.

5. The bump pad structure of claim 1, wherein the conductive material includes nickel.

6. A method for preparing a bump pad structure, comprising:
    depositing a bump pad upon a substrate;
    depositing a solder mask upon the substrate such that the solder mask defines an opening around the bump pad; and
    plating or printing a conductive material upon the bump pad such that the conductive material at least partially fills the opening around the bump pad.

7. The method of claim 6, wherein the conductive material deposited upon the bump pad reduces a height of the solder mask above the bump pad.

8. The method of claim 6, wherein the conductive material includes copper.

9. The method of claim 6, wherein the conductive material includes gold.

10. The method of claim 6, wherein the conductive material includes nickel.

\* \* \* \* \*